United States Patent
Kim et al.

(10) Patent No.: US 10,901,530 B2
(45) Date of Patent: Jan. 26, 2021

(54) THREE-DIMENSIONAL MAGNETIC SENSOR BASED FINGER MOTION CAPTURE INTERFACE DEVICE

(71) Applicant: Center of Human-centered Interaction for Coexistence, Seoul (KR)

(72) Inventors: Mincheol Kim, Seoul (KR); Cong Vu Luc, Seoul (KR); Jai Hi Cho, Seoul (KR); Ju Seong Lee, Seoul (KR); Bum Jae You, Seoul (KR)

(73) Assignee: Center of Human-centered Interaction for Coexistence, Seoul (KR)

( * ) Notice: Subject to any disclaimer, the term of this patent is extended or adjusted under 35 U.S.C. 154(b) by 351 days.

(21) Appl. No.: 16/073,587

(22) PCT Filed: Jun. 19, 2018

(86) PCT No.: PCT/KR2018/006890
§ 371 (c)(1),
(2) Date: Jul. 27, 2018

(87) PCT Pub. No.: WO2019/035546
PCT Pub. Date: Feb. 21, 2019

(65) Prior Publication Data
US 2020/0393916 A1      Dec. 17, 2020

(30) Foreign Application Priority Data
Aug. 18, 2017    (KR) ........................ 10-2017-0104935

(51) Int. Cl.
*G06F 3/0346* (2013.01)
*G06F 3/01* (2006.01)
*G01R 33/02* (2006.01)

(52) U.S. Cl.
CPC ............ *G06F 3/0346* (2013.01); *G06F 3/014* (2013.01); *G06F 3/016* (2013.01); *G01R 33/02* (2013.01)

(58) Field of Classification Search
CPC ........ G06F 3/0346; G06F 3/016; G06F 3/014; G01R 33/02
See application file for complete search history.

(56) References Cited

U.S. PATENT DOCUMENTS 4,986,280 A * 1/1991 Marcus .................. A61B 5/103
33/512
5,512,919 A * 4/1996 Araki ...................... G06F 3/014
345/156

(Continued)

FOREIGN PATENT DOCUMENTS

KR    10-2003-0006020 A    1/2003
KR    10-2014-0051554 A    5/2014

(Continued)

*Primary Examiner* — Amit Chatly
(74) *Attorney, Agent, or Firm* — Novick, Kim & Lee, PLLC; Sang Ho Lee (57) ABSTRACT

Provided is a three-dimensional magnetic sensor based finger motion capture interface device, including a back-of-hand fixing member; a finger wearing member; at least one link member which is disposed between the back-of-hand fixing member and the finger wearing member and includes at least one magnetic sensor; at least one fixing member which connects between a plurality of link members; and a controller which receives sensor coordinate values corresponding to the change of a magnetic line of force sensed by the at least one magnetic sensor, extracts pitch and yaw motions of each link member based on the received sensor coordinate values, and calculates a user's finger position based on the extracted pitch and yaw motion values.

9 Claims, 9 Drawing Sheets

(56) References Cited

U.S. PATENT DOCUMENTS

| | | | | |
|---|---|---|---|---|
| 6,104,379 | A * | 8/2000 | Petrich | G06F 3/014 |
| | | | | 345/156 |
| 6,110,130 | A * | 8/2000 | Kramer | A61B 5/1071 |
| | | | | 600/587 |
| 6,526,669 | B2 * | 3/2003 | Nagata | A61B 5/1125 |
| | | | | 33/503 |
| 8,562,049 | B2 * | 10/2013 | Ihrke | B25J 9/104 |
| | | | | 294/106 |
| 9,104,271 | B1 * | 8/2015 | Adams | G06F 3/014 |
| 2005/0184884 | A1 * | 8/2005 | Kim | G06F 3/014 |
| | | | | 341/22 |
| 2007/0002015 | A1 * | 1/2007 | Mohri | G06K 9/00375 |
| | | | | 345/157 |
| 2011/0118753 | A1 * | 5/2011 | Itkowitz | G06F 3/014 |
| | | | | 606/130 |
| 2013/0207890 | A1 * | 8/2013 | Young | G10H 1/34 |
| | | | | 345/156 |
| 2019/0005733 | A1 * | 1/2019 | Wehner | G06F 3/038 |
| 2020/0042323 | A1 * | 2/2020 | Sano | G06F 3/04883 |

FOREIGN PATENT DOCUMENTS

| | | |
|---|---|---|
| KR | 10-2015-0026507 A | 3/2015 |
| KR | 10-1525226 B1 | 6/2015 |
| KR | 10-1571314 B1 | 11/2015 |
| KR | 10-1764328 B1 | 8/2017 |

* cited by examiner

THREE-DIMENSIONAL MAGNETIC SENSOR BASED FINGER MOTION CAPTURE INTERFACE DEVICE

TECHNICAL FIELD

The present invention relates to a three-dimensional magnetic sensor based finger motion capture interface device, and more particularly, to a three-dimensional magnetic sensor based finger motion capture interface device which precisely measures a motion at a low manufacturing cost by applying a mechanism having four degrees of freedom which is capable of precisely detecting and measuring a motion of a finger using a low-price non-contact type three-dimensional magnetic sensor.

BACKGROUND ART

Recently, since the launch of a low-cost head mounted device (HMD), interest of market in virtual reality is growing. Therefore, research on various fields related to the virtual reality is being performed. As a result, various types of hardware and software products are being released. Among various research fields, a hand motion capture for tracking a user's hand motion is aimed at recognizing the hand of the user in any environments and providing a realistic experience in various situations. The hand motion capture field is still in a researching stage and various attempts have been made.

Several techniques for measuring a finger motion of the user and applying the finger motion to the virtual reality have been introduced. For example, there are a system of attaching an optical marker to the finger to track the marker using a camera and a technique of measuring a finger motion by forming a glove or exoskeleton using a bending sensor or a potentiometer. However, among the methods introduced in the related art, the optical marker has problems in that an external camera system is necessary and marker overlapping and blocking phenomenon occur. Further, a technique of measuring the finger motion is expensive or measures only 1 to 2 degrees of freedom per finger so that the finger motion may not be precisely measured. Further, an image and an IR sensor have problems in that only the motions in the viewing field are measured and a measurement value is not accurate due to an overlapping problem of the fingers.

In the meantime, "Motion capture system using inertial sensor" is disclosed in Korean Unexamined Patent Application Publication No. 10-2014-0051554 (Patent Document 1). The motion capture system using an inertial sensor includes a plurality of first sensing elements mounted in an upper part of a human body, a plurality of second sensing elements mounted in a lower part of the human body, a first communication unit connected to the plurality of first sensing elements, a second communication unit connected to the plurality of second sensing elements, a motion data collecting unit which collects motion data of the human body transmitted from the first communication unit and the second communication unit, and a display unit which displays the motion of the human body collected by the motion data collecting unit. The plurality of first sensing elements is mounted on at least the vicinity of the center of the spine of the human body, the upper left arm, the upper right arm, the lower left arm, the lower right arm, the left hand, the right hand, and the head to sense the motion of the joints in nine axes. The plurality of second sensing elements is mounted on at least on the pelvis of the human body, the left thigh, the right thigh, the left calf, the right calf, the left foot, and the right foot to sense the motion of the joints in nine axes.

In the case of Patent Document 1 described above, each sensor node completes the data analysis and transmits only the collected information to an output device so that a separate external working station is not necessary. Therefore, it can be effectively applied in terms of processing speed and cost. However, since the first and second sensing elements include a geomagnetic sensor, an accelerometer sensor, and a gyro sensor, the manufacturing cost of the system is relatively high. Further, the motion of the joint is sensed in nine axes so that the motion capture process is relatively complex and the usage time is increased so that a measurement error is gradually increased.

DISCLOSURE

Technical Problem

In order to solve the above-mentioned problems, an object of the present invention is to provide a three-dimensional magnetic sensor based finger motion capture interface device which precisely measures a motion at a low manufacturing cost by applying a mechanism having four degrees of freedom which is capable of precisely measuring a motion of the finger using a low-cost non-contact type three-dimensional magnetic sensor which senses the motion of the finger.

Another object of the present invention is to provide a three-dimensional magnetic sensor based finger motion capture interface device which provides a user in a real world with the touch feeling as if the user touches a real-world object by installing a touch feeling generating actuator at a fingertip and generating a vibration when a tracked virtual finger touches a virtual object.

Technical Solution

According to an aspect of the present invention, a three-dimensional magnetic sensor based finger motion capture interface device, includes: a back-of-hand fixing member in which a coupling hole is formed at one side, a first link member which is mechanically coupled to the coupling hole of the back-of-hand fixing member and has a first magnet installed therein, a second link member in which one end connected to the first link member is formed by a first spherical joint unit, a first gear is formed at the other end, and a first magnetic sensor is embedded in the first spherical joint unit, a first fixing member which fixes the second link member to the first link member through a second gear which is combined with the first gear of the second link member, a third link member having one end which is pivotably coupled to the first fixing member, a fourth link member in which a second spherical joint unit having a second magnetic sensor is formed in one end and a third gear is formed at the other end, a second fixing member which couples the fourth link member to the third link member through a fourth gear which is combined with the third gear of the fourth link member, a fifth link member which is coupled to the second fixing member and has a second magnet provided therein, a finger wearing member which is coupled to the fifth link member and has a finger seating member, and a controller which receives sensor coordinate values corresponding to the change of a magnetic line of force sensed by the first magnetic sensor of the second link member and the second magnetic sensor of the fourth link member, extracts pitch and yaw motions of each link member based on the received sensor coordinate values, and calculates a user's finger position based on the extracted pitch and yaw motion values.

Here, the coupling hole of the back-of-hand fixing member may have a form of an elongated hole.

Further, the first magnet may be configured by one pair of magnets which is disposed such that a magnetic line of force flowing from an N pole of one magnet flows into an S pole of the other magnet and center axis lines of the pair of magnets perpendicularly intersect each other.

Further, the first gear of the second link member and the second gear of the first fixing member may be combined with each other to form one bevel gear structure.

Further, the third gear of the fourth link member and the fourth gear of the second fixing member may be combined with each other to form one bevel gear structure.

Further, the second magnet of the fifth link member may be configured by one pair of magnets which is disposed such that a magnetic line of force flowing from an N pole of one magnet flows into an S pole of the other magnet and center axis lines of the pair of magnets perpendicularly intersect each other.

Further, the finger seating unit of the finger wearing member may be formed to have a curved surface having a predetermined curvature.

Further, a touch feeling generating actuator which transmits a feedback when a tracked virtual finger touches a virtual object may be provided at an end of the finger wearing member.

Further, the controller reads a motion having two degrees of freedom from the first magnetic sensor of the second link member and reads a motion having two degrees of freedom from the second magnetic sensor of the fourth link member to receive a motion having four degrees of freedom.

Further, the controller may convert a magnetic vector value (Bx, By, Bz) received from the first magnetic sensor and the second magnetic sensor into rotation movements of the second link member and the fourth link member and apply the rotation movements to a forward kinetic equation to extract a shape of a multi-joint exoskeleton mechanism to calculate a position and a direction of the finger wearing member.

According to another aspect of the present invention, a three-dimensional magnetic sensor based finger motion capture interface device, includes: a back-of-hand fixing member, a finger wearing member, at least one link member which is disposed between the back-of-hand fixing member and the finger wearing member and includes at least one magnetic sensor, at least one fixing member which connects between a plurality of link members, and a controller which receives sensor coordinate values corresponding to the change of a magnetic line of force sensed by the at least one magnetic sensor, extracts pitch and yaw motions of each link member based on the received sensor coordinate values, and calculates a user's finger position based on the extracted pitch and yaw motion values.

Advantageous Effects

According to the present invention, a mechanism having four degrees of freedom which is capable of precisely measuring a motion of the finger using a low-cost non-contact type three-dimensional magnetic sensor which senses the motion of the finger is applied to precisely measure the motion at a low manufacturing cost.

BEST MODE

Terms or words used in the present specification and claims should not be construed as limited to a normal or dictionary meaning but may be interpreted with meanings and concept in accordance with the technical spirit of the present invention based on a principle that the inventor may appropriately define the concept of the term in order to explain the invention at the best way. Throughout the specification, unless explicitly described to the contrary, the word "comprise" and variations such as "comprises" or "comprising", will be understood to imply the inclusion of stated elements but not the exclusion of any other elements. In addition, the terms "-er", "-or" and "module" described in the specification mean units for processing at least one function and operation and can be implemented by hardware components or software components and combinations thereof.

Hereinafter, the exemplary embodiment of the present invention will be described in detail with reference to the accompanying drawings.

Figure 1:
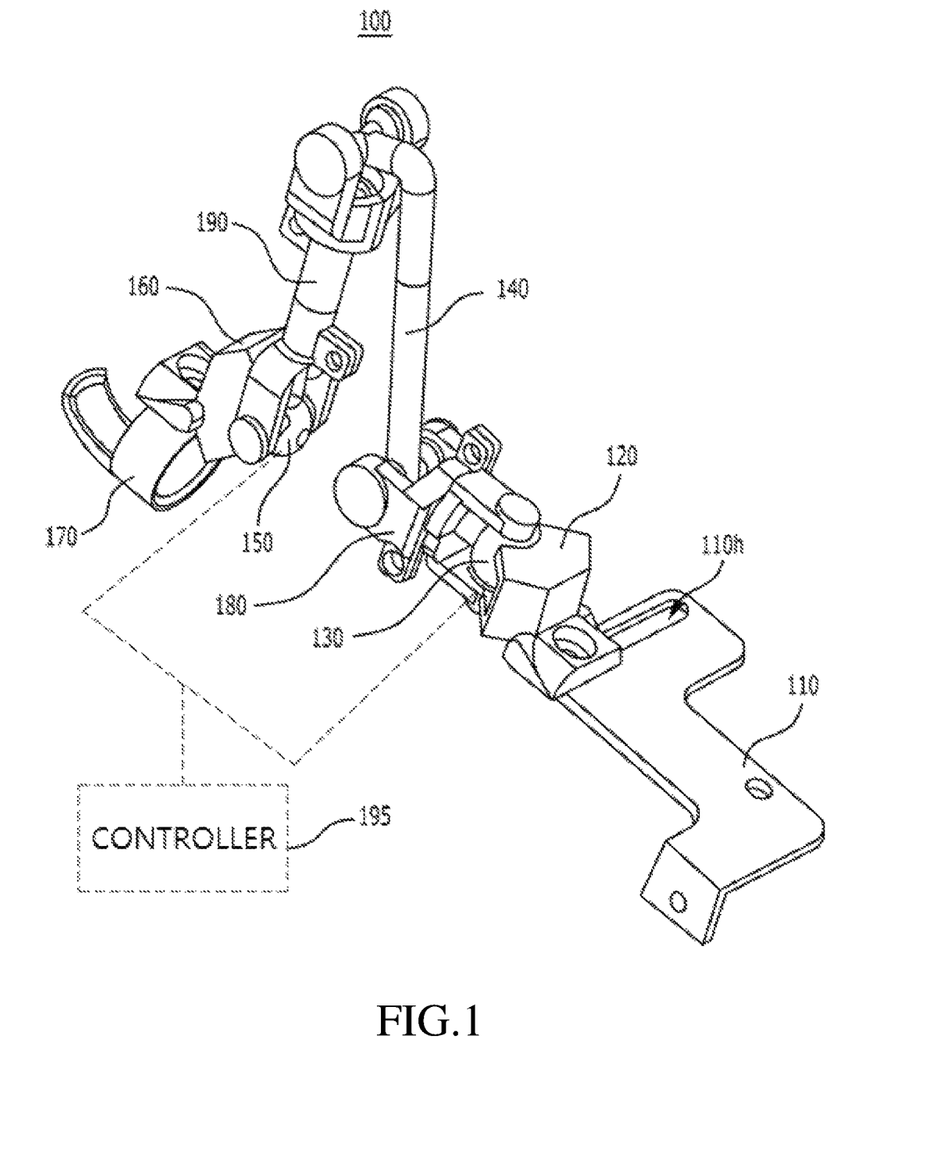
FIG. 1 is a view illustrating an overall configuration of a three-dimensional magnetic sensor based finger motion capture interface device according to the present invention.

FIG. 1 is a view illustrating an overall configuration of a three-dimensional magnetic sensor based finger motion capture interface device according to an exemplary embodiment of the present invention.

Referring to FIG. 1, a three-dimensional magnetic sensor based finger motion capture interface device 100 according to the present invention includes a back-of-hand fixing member 110, a finger wearing member 170, at least one link member, at least one fixing member, and a controller 195. In this case, as at least one link member and at least one fixing member, various numbers of link members or fixing members may be provided.

Hereinafter, for example, a specific operating principle when at least one link member is configured by five link members including a first link member 120, a second link member 130, a third link member 140, a fourth link member 150, and a fifth link member 160 and at least one fixing member is configured by two fixing members including a first fixing member 180 and a second fixing member 190 will be described.

The three-dimensional magnetic sensor based finger motion capture interface device 100 according to the present invention is a finger motion capture interface device which is worn in the hand of the user to measure a user's finger motion and includes a back-of-hand fixing member 110, the first link member 120, the second link member 130, the first fixing member 180, the third link member 140, the fourth link member 150, the second fixing member 190, the fifth link member 160, the finger wearing member 170, and the controller 195.

Figure 2:
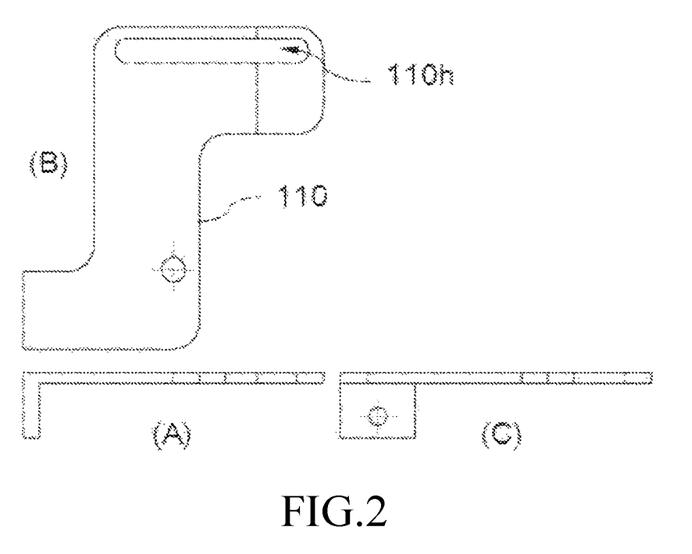
FIG. 2 is a view illustrating a structure of a back-of-hand fixing member of a three-dimensional magnetic sensor based finger motion capture interface device according to the present invention.

The back-of-hand fixing member 110 is provided to fix the back of the hand of the user and a coupling hole 110h for being coupled to other components (the first link member 120 in this case) is formed at one side of the body of the back-of-hand fixing member. Here, desirably, the coupling hole 110h formed on the back-of-hand fixing member 110 is formed to be an elongated hole as illustrated in FIG. 2. The elongated hole is provided for improving a horizontal movability of the first link member 120 which is coupled to the coupling hole 110h. FIG. 2 illustrates a structure of the back-of-hand fixing member 110 in which (A) is a front view, (B) is a plan view, and (C) is a side view.

Figure 14:
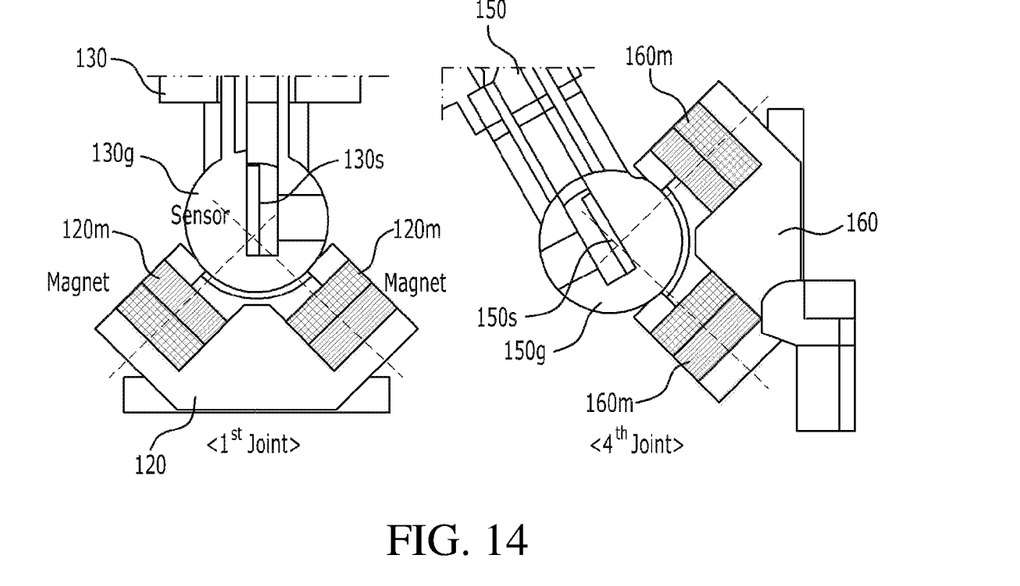
FIG. 14 is a view illustrating an arrangement of sensors and magnets installed at a first joint and a fourth joint of a three-dimensional magnetic sensor based finger motion capture interface device according to the present invention.

The first link member 120 is movably and mechanically coupled to the back-of-hand fixing member 110 and a first magnet 120m (see FIG. 14) for forming a magnetic field is installed in the body. Here, as described above, the first magnet 120m installed in the body of the first link member 120 is configured by a pair of magnets as illustrated in FIG. 14. The pair of magnets is disposed such that magnetic lines of force flowing from an N pole of one magnet flows into an S pole of the other magnet and center axes of the magnets perpendicularly intersect each other.

Here, the reason that the pair of magnets is disposed such that the center axes perpendicularly intersect each other is to allow the first magnetic sensor 130s to sense the magnetic line of force which flows from the N pole of one magnet to flow into the S pole of the other magnet at high efficiency.

Figure 3:
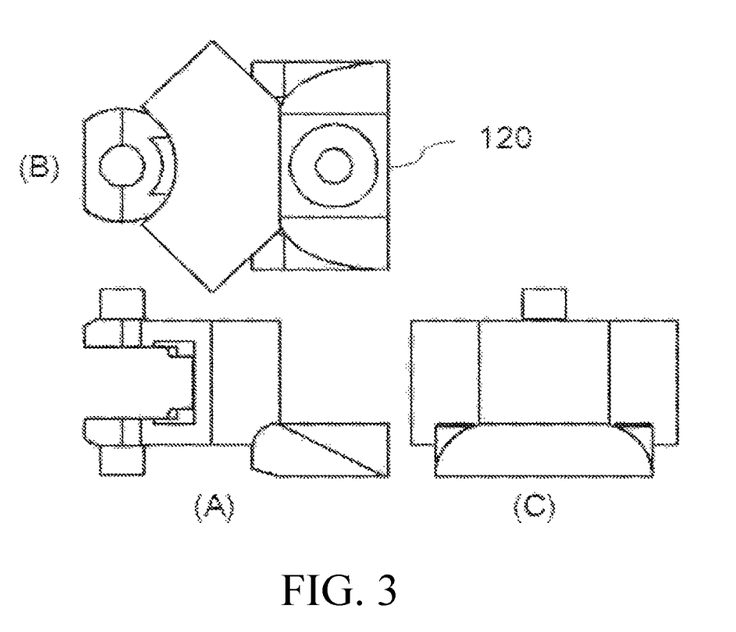
FIG. 3 is a view illustrating a structure of a first link member of a three-dimensional magnetic sensor based finger motion capture interface device according to the present invention.

Further, in the exemplary embodiment (FIG. 14), it is described (illustrated) that a permanent magnet is used as the first magnet 120m described above. However, the magnet is not necessarily limited to the permanent magnet, but an electromagnet may be used in some cases. FIG. 3 illustrates a structure of the first link member 120 in which (A) is a front view, (B) is a plan view, and (C) is a side view.

Figure 4:
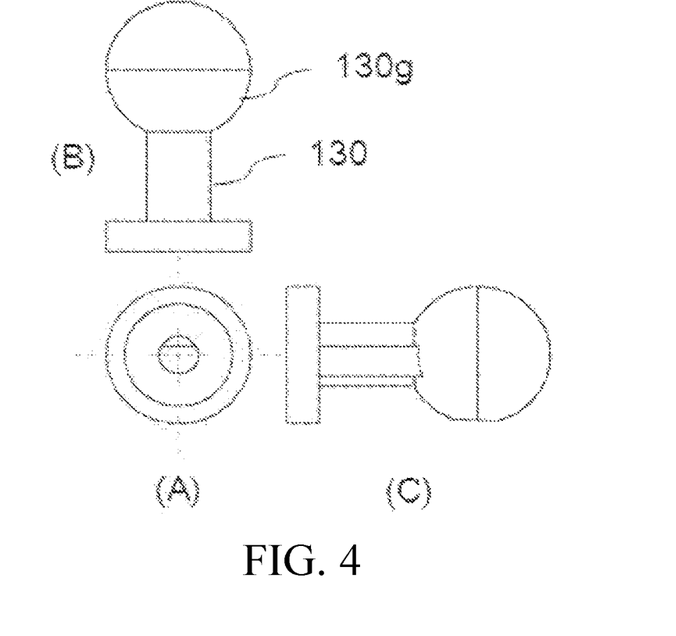
FIG. 4 is a view illustrating a structure of a second link member of a three-dimensional magnetic sensor based finger motion capture interface device according to the present invention.

As illustrated in FIG. 4, one end of the body of the second link member 130 is formed by a spherical joint unit 130g so that the second link member 130 can perform a spherical joint motion with respect to the first link member 120 and a gear is formed at the other end of the body to transmit rotational movement force. As illustrated in FIG. 14, in the spherical joint unit 130g, the first magnetic sensor 130s for sensing a magnetic line of force generated by the first magnet 120m of the first link member 120 is provided. FIG. 4 illustrates a structure of the second link member 130 as described above in which (A) is a front view, (B) is a plan view, and (C) is a side view.

Figure 9:
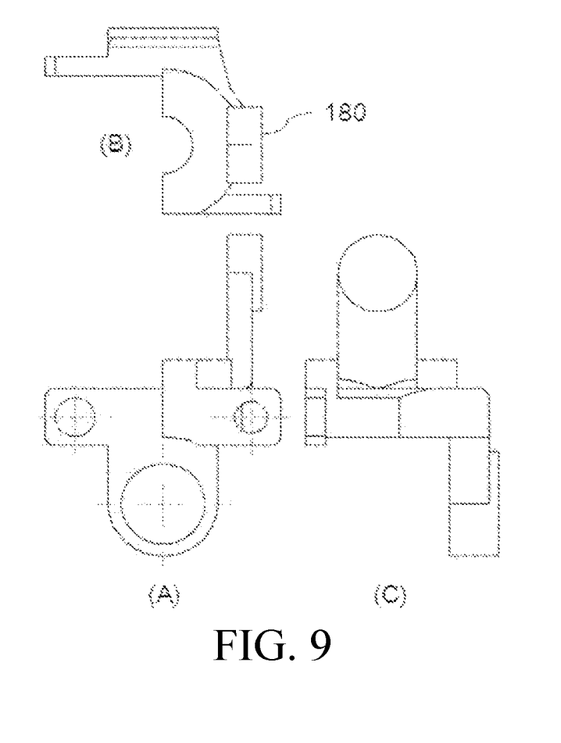
FIG. 9 is a view illustrating a structure of a first fixing member of a three-dimensional magnetic sensor based finger motion capture interface device according to the present invention.
Figure 11:
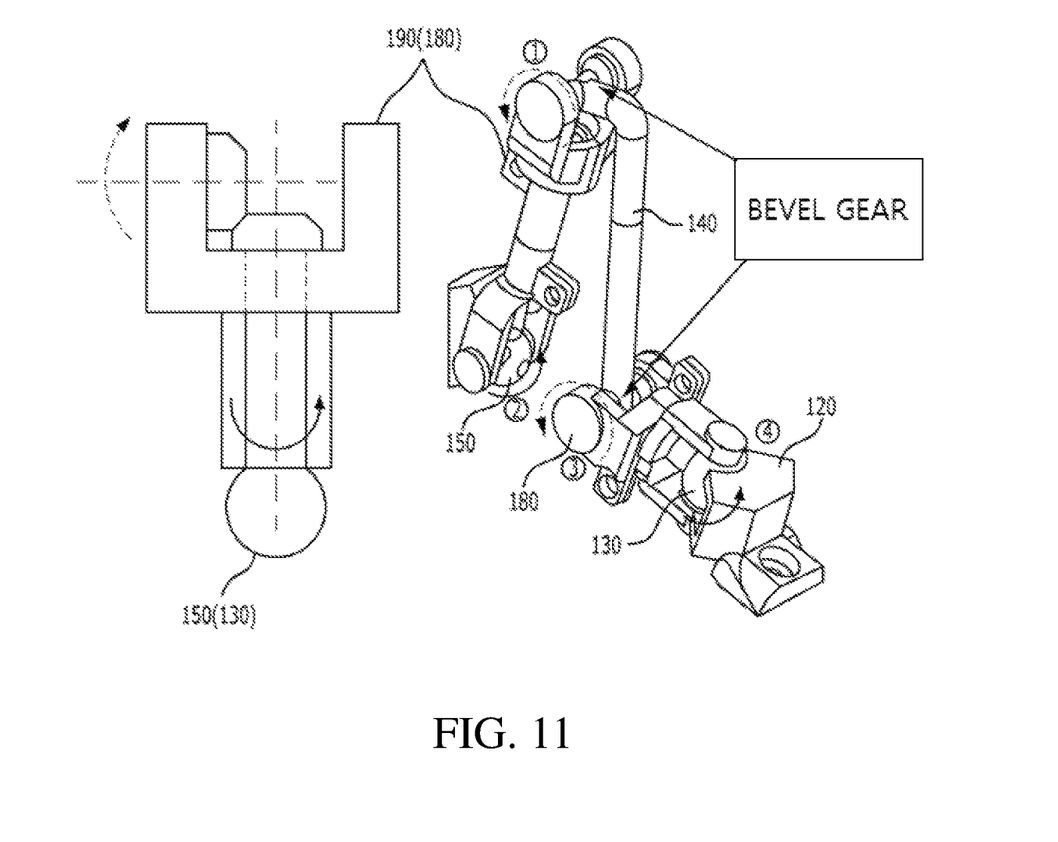
FIG. 11 is a view explaining for a motion of a joint by a bevel gear of a three-dimensional magnetic sensor based finger motion capture interface device according to the present invention.

The first fixing member 180 has a gear formed at a predetermined portion of the body to be combined with the gear formed at the end of the second link member 130 and fixes the second link member 130 to the first link member 120 so that the second link member 130 allows the first link member 120 to perform a spherical joint motion. Here, as illustrated in FIG. 11, the gear formed at the end of the second link member 130 and the gear formed in the first fixing member 180 are combined with each other to form one bevel gear structure. FIG. 9 illustrates a structure of the first fixing member 180 as described above in which (A) is a front view, (B) is a plan view, and (C) is a side view. Further, FIG. 11 is a view explaining a motion of the joint by the bevel gear and a motion (1) causes a motion (2) and a motion (3) causes a motion (4).

Figure 5:
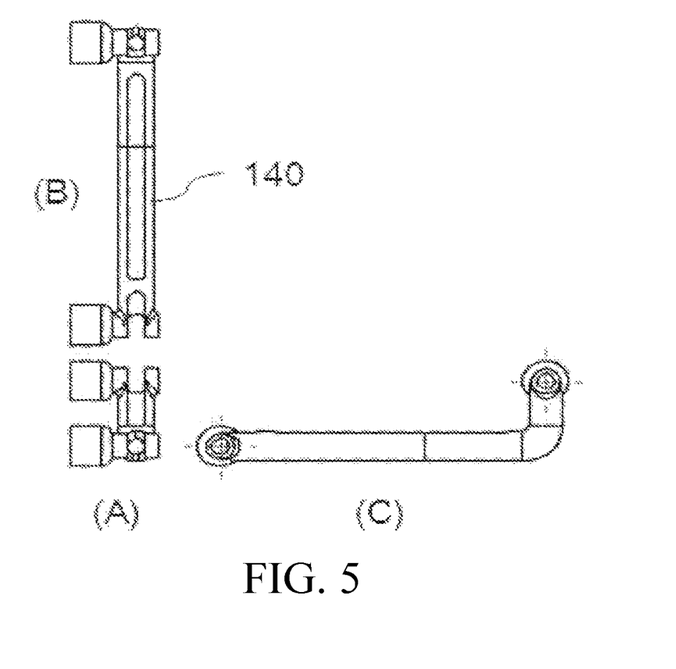
FIG. 5 is a view illustrating a structure of a third link member of a three-dimensional magnetic sensor based finger motion capture interface device according to the present invention.

The third link member 140 is formed such that one end of the body thereof is coupled to the first fixing member 180 to perform pivot movement. FIG. 5 illustrates a structure of the third link member 140 as described above in which (A) is a front view, (B) is a plan view, and (C) is a side view.

Figure 6:
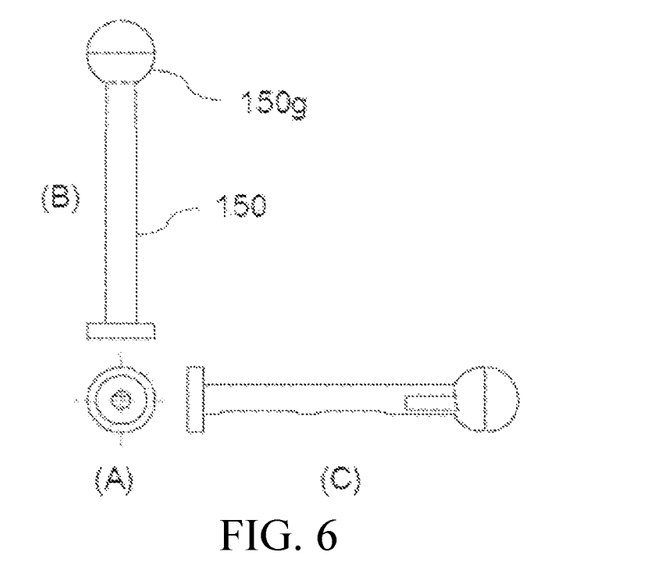
FIG. 6 is a view illustrating a structure of a fourth link member of a three-dimensional magnetic sensor based finger motion capture interface device according to the present invention.

As illustrated in FIG. 6, the fourth link member 150 is formed such that one end of the body is formed by a spherical joint unit 150g in which the second magnetic sensor 150s (see FIG. 14) for sensing a magnetic line of force (a magnetic line of force generated from the second magnet 160m of the fifth link member 160 which will be described below) is provided and a gear is formed at the other end of the body to transmit a rotational movement force. FIG. 6 illustrates a structure of the fourth link member 150 in which (A) is a front view, (B) is a plan view, and (C) is a side view.

Figure 10:
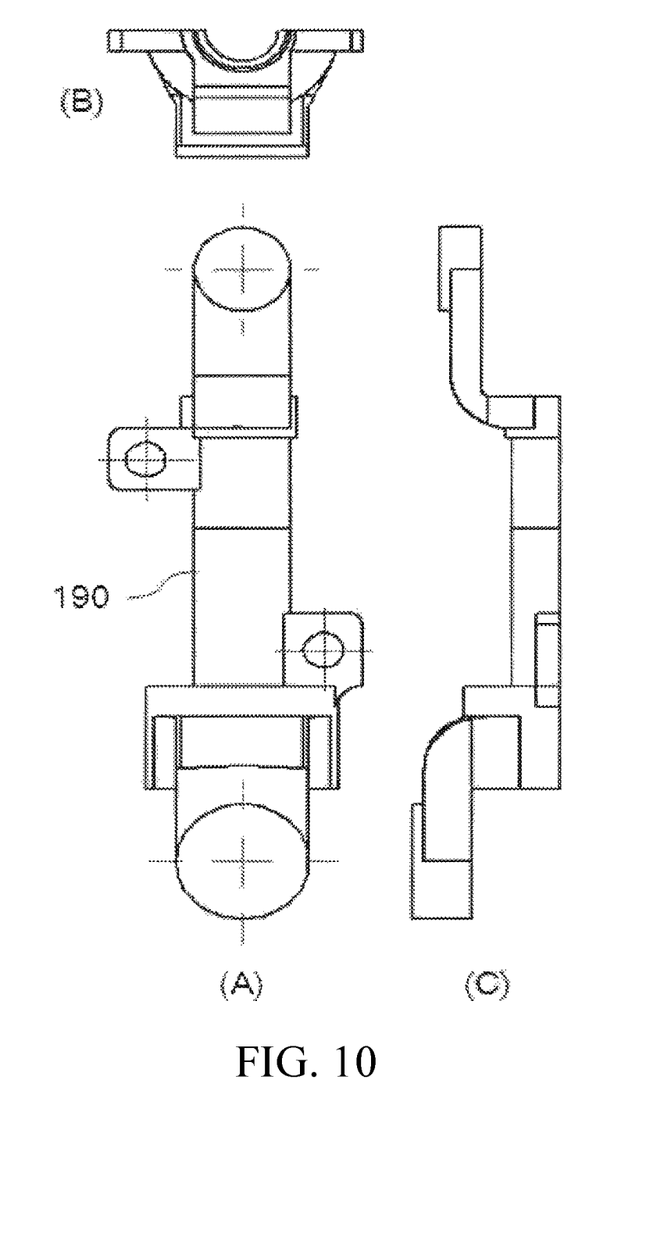
FIG. 10 is a view illustrating a structure of a second fixing member of a three-dimensional magnetic sensor based finger motion capture interface device according to the present invention.

The second fixing member 190 has a gear formed at a predetermined portion of the body to be combined with the gear formed at the end of the body of the fourth link member 150 and couples and fixes the fourth link member 150 to the third link member 140. FIG. 10 illustrates a structure of the second fixing member 190 in which (A) is a front view, (B) is a plan view, and (C) is a side view.

Here, the gear formed at the end of the fourth link member 150 and the gear formed in the second fixing member 190 are combined with each other to form one bevel gear structure.

The fifth link member 160 is coupled to the second fixing member 190 and as illustrated in FIG. 14, the second magnet 160*m* for forming a magnetic field is installed in the body thereof. Here, as described above, the second magnet 160*m* installed in the body of the fifth link member 160 is configured by a pair of magnets. The pair of magnets is disposed such that magnetic lines of force flowing from an N pole of one magnet flows into an S pole of the other magnet and center axes of the magnets perpendicularly intersect each other.

Figure 7:
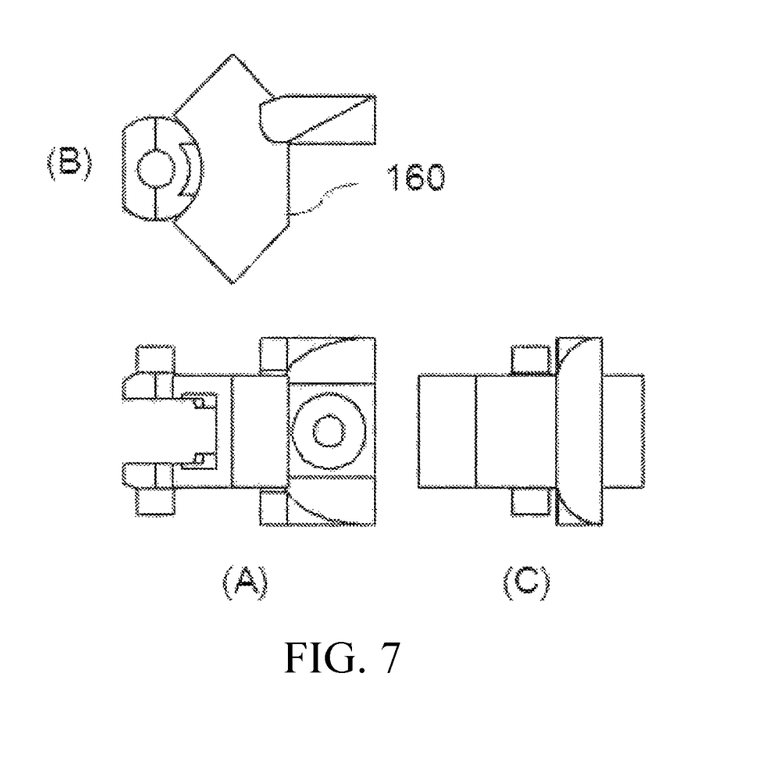
FIG. 7 is a view illustrating a structure of a fifth link member of a three-dimensional magnetic sensor based finger motion capture interface device according to the present invention.

Here, as described above, the reason that the pair of magnets is disposed such that the center axes perpendicularly intersect each other is to allow the second magnetic sensor 150*s* to sense the magnetic line of force which flows from the N pole of one magnet to flow into the S pole of the other magnet at high efficiency. Further, in the exemplary embodiment (FIG. 14), it is described (illustrated) that a permanent magnet is used as the second magnet 160*m* described above. However, similarly to the first magnet 120*m*, the magnet is not necessarily limited to the permanent magnet, but an electromagnet may be used in some cases. FIG. 7 illustrates a structure of the fifth link member 160 in which (A) is a front view, (B) is a plan view, and (C) is a side view.

Figure 8:
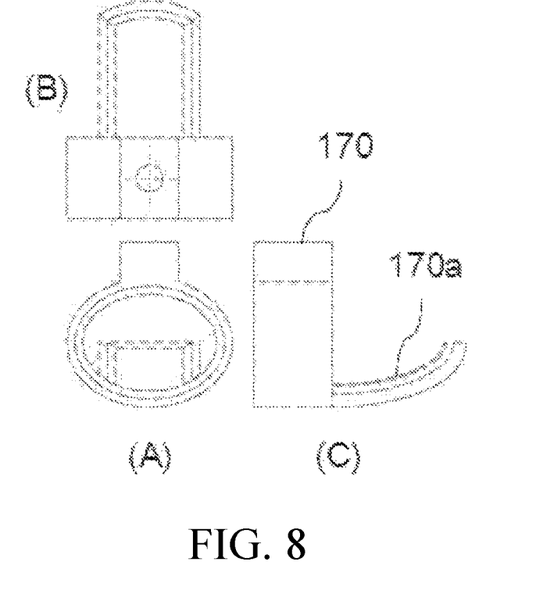
FIG. 8 is a view illustrating a structure of a finger wearing member of a three-dimensional magnetic sensor based finger motion capture interface device according to the present invention.

The finger wearing member 170 is coupled to the fifth link member 160 and as illustrated in FIG. 8, a finger seating unit 170*a* to which the user pushes the finger to be seated is formed at one side of the body thereof. Here, the finger seating unit 170*a* of the finger wearing member 170 may be formed to have a curved surface having a predetermined curvature so that the finger searing unit 170*a* is naturally contacted with a bottom surface of the finger. Further, a touch feeling generating actuator (for example, a vibration actuator) which generates vibration when the tracked virtual finger touches the virtual object may be further provided at an end of the finger seating unit 170*a* of the finger wearing member 170. As described above, when the vibration actuator is provided as the touch feeling generating actuator, if the tracked virtual finger touches the virtual object, vibration is generated by the operation of the actuator so that the user in the real world may experience a touch feeling as if the user touches a real-world object. FIG. 8 illustrates a structure of the finger wearing member 170 in which (A) is a front view, (B) is a plan view, and (C) is a side view.

The controller 195 receives a sensor coordinate system value corresponding to a change of magnetic lines of force sensed by the first magnetic sensor of the second link member and the second magnetic sensor of the fourth link member, extracts pitch and yaw motions of each link based on the received sensor coordinate system value, and calculates a position of the finger of the user based on the extracted pitch and yaw motion values. The controller 195 is configured such that two-degree of freedom motion is read from the first magnetic sensor 130*s* installed in the body of the second link member 130 and two-degree of freedom motion is read from the second magnetic sensor 150*s* installed in the body of the fourth link member 150 to receive a total of four-degree of freedom motion. Further, the controller 195 may transmit sensor data or calculated position data and receive necessary information through a wired or wireless network.

Further, the controller 195 may be configured to convert magnetic vector values Bx, By, Bz received from the first and second magnetic sensors 130*s* and 150*s* into rotation movements of the second link member 130 and the fourth link member 150 and apply the rotation movements to a forward kinematic equation to extract a shape of multi-joint exoskeleton mechanism, thereby calculating a position and a direction of the finger wearing member 170.

Therefore, a configuration and an operating relationship of the three-dimensional magnetic sensor based finger motion capture interface device 100 according to the present invention having the above-described configuration will be described in detail.

Figure 12:
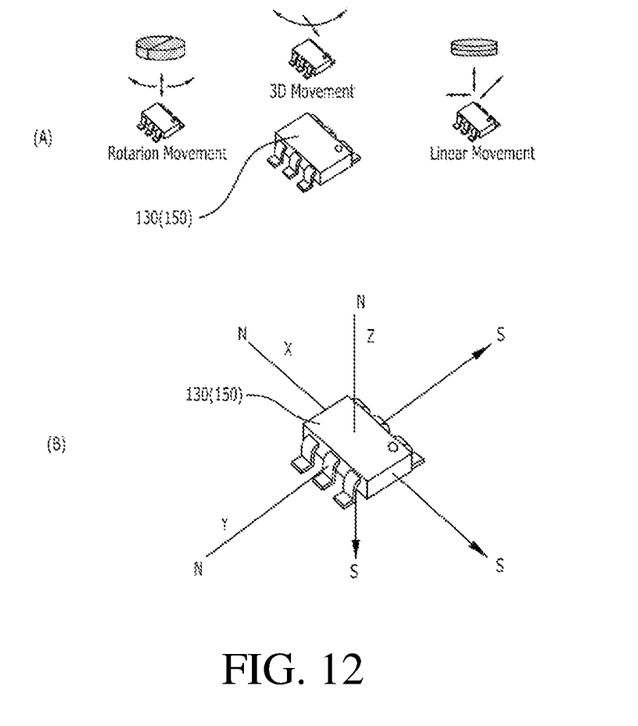
FIG. 12 is a view illustrating a magnetic field measuring sensor employed in a three-dimensional magnetic sensor based finger motion capture interface device according to the present invention and a sensor coordinate system using the same.

FIG. 12 is a view illustrating a magnetic field measuring sensor employed in a three-dimensional magnetic sensor based finger motion capture interface device according to the present invention and a sensor coordinate system using the same.

Referring to FIG. 12, (A) illustrates a low-price non-contact type three axle magnetic field measuring sensor employed in the three-dimensional magnetic sensor based finger motion capture interface device 100 according to the present invention and (B) illustrates a sensor coordinate system using the same.

The low-price non-contact type three axle magnetic field measuring sensors, as illustrated in FIG. 12(A), which may measure a position and is one dollar or cheaper, may obtain three axle magnetic field intensity in a non-contact manner, at a speed of up to 3.3 KHz through a high speed serial communication such as inter-integrated circuit $I^2C$. Therefore, a real-time measurement performance is excellent and thus a high speed capturing is possible.

A direction and a magnitude of a vector of the magnetic line of force generated from the first magnet 120*m* installed in the first link member 120 and the second magnet 160*m* installed in the fifth link member 160 are measured as values of reference magnetic fluxes Bx, By, Bz of the sensor coordinate system of FIG. 12(B). When the sensor is fixed to a center of rotation and the magnet rotates therearound, the vector may be theoretically measured with three degrees of freedom. However, a rotation of a vector axis direction (roll) cannot be measured due to a singularity problem. Therefore, in the present invention, a multi-joint exoskeleton mechanism in which one sensor is provided per joint is introduced so that four degrees of freedom rotation can be measured using a total of two sensors.

Figure 13:
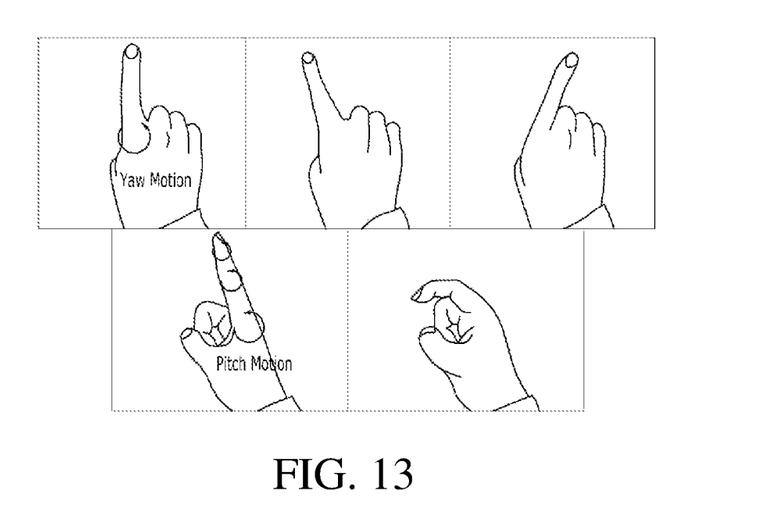
FIG. 13 is a photograph illustrating a basic structure of a human finger.

It is assumed that the finger of human basically has four degrees of freedom. As illustrated in FIG. 13, a pitch motion and a yaw motion are allowed at a first joint and pitch motions are allowed at next two joints. When a mechanism in which four degrees of freedom motion is allowed is designed based thereon, an exoskeleton which may capture all four degrees of freedom of the finger is created. FIG. 13 is a photograph illustrating a basic structure of a human finger.

If the human fingers are configured by individual rotary joints similarly to the robot joints, the design may be simple. However, the human fingers take several motions in one joint. Therefore, the mechanism of the present invention employs a spherical joint structure to allow various motions in one joint and a non-contact type 3D magnetic sensor is utilized to measure the rotation movement of the joint.

Even though the sensor used in the present invention is a 3D magnetic sensor, when the magnetic vector is directed to the sensor, only the pitch and yaw motions are allowed, but the roll motion in the magnetic vector direction cannot be measured. Therefore, a motion having four degrees of freedom needs to be converted into pitch and yaw motions in a total of two spherical joints. To this end, the present invention employs the bevel gear structure and a model employing such a structure is the above-described three-dimensional magnetic sensor based finger motion capture interface device 100 according to the present invention of FIG. 1.

Referring to FIG. 1, the first joint, that is, the first magnetic sensor 130s inserted into the second link member 130 reads the yaw motion of the second link member 130 as the yaw motion as it is. The pitch motion of the third link (the third link member 140) is converted into a roll motion in the first joint (the second link member 130) due to the bevel gear structure, which is just a roll motion on the link structure but is not a roll motion based on the magnetic vector. Therefore, the roll motion is measurable in the magnetic sensor. Further, the pitch motion of the third link (the third link member 140) is converted into the roll motion in the fourth joint (the fourth link member 150) and finally, the pitch motion of the fourth joint (the fourth link member 150) is accepted as a pitch as it is. As a result, multi-joint coupling structures are symmetrical with each other with respect to the third link (the third link member 140) and the mechanism may accept a motion of a total of four degrees of freedom. An arrangement of the sensors and magnets inserted into the first joint and the fourth joint is as illustrated in FIG. 14. The arrangement of the sensors or the magnets may vary depending on the embodiment.

Figure 15:
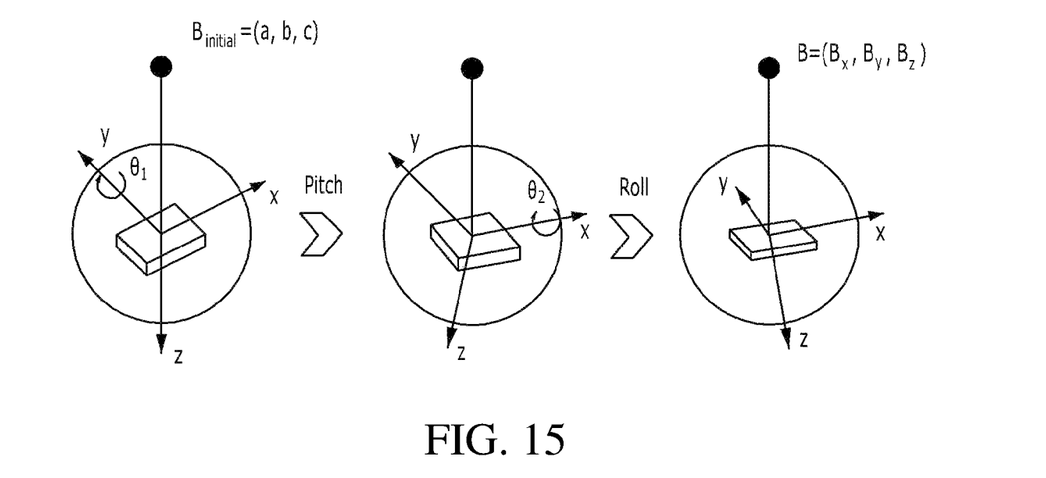
FIG. 15 is a view illustrating a correlation of a data value of each joint reference sensor of a three-dimensional magnetic sensor based finger motion capture interface device according to the present invention and a motion of a multi-joint mechanism.

FIG. 15 is a view illustrating a correlation of a data value of each joint reference sensor and a motion of a multi-joint mechanism.

Referring to FIG. 15, magnetic fluxes Bx, By, and Bz received from each sensor may be converted into pitch and yaw motions of each link through the following equation.

<First joint>

$$\begin{pmatrix} 1 & 0 & 0 \\ 0 & \cos\theta_2 & \sin\theta_2 \\ 0 & -\sin\theta_2 & \cos\theta_2 \end{pmatrix} \begin{pmatrix} \cos\theta_1 & 0 & -\sin\theta_1 \\ 0 & 1 & 0 \\ \sin\theta_1 & 0 & \cos\theta_1 \end{pmatrix} \begin{pmatrix} a \\ b \\ c \end{pmatrix} = \begin{pmatrix} B_x \\ B_y \\ B_z \end{pmatrix}$$

$$\theta_1 = a\tan 2\left(\sqrt{a^2 + c^2 - B_x^2}, B_x\right) - a\tan 2(c, a), \left(-\frac{\pi}{2} \le \theta_1 \le \frac{\pi}{2}\right)$$

$$\theta_2 = a\tan 2\left(B_y, \sqrt{X^2 + b^2 - B_y^2}\right) - a\tan 2(b, X), \left(-\frac{\pi}{2} \le \theta_2 \le \frac{\pi}{2}\right)$$

$$X \equiv -a(\sin\theta_1) + c(\cos\theta_1)$$

<Fourth joint>

$$\begin{pmatrix} 1 & 0 & 0 \\ 0 & \cos\theta_3 & \sin\theta_3 \\ 0 & -\sin\theta_3 & \cos\theta_3 \end{pmatrix} \begin{pmatrix} \cos\theta_4 & 0 & -\sin\theta_4 \\ 0 & 1 & 0 \\ \sin\theta_4 & 0 & \cos\theta_4 \end{pmatrix} \begin{pmatrix} a \\ b \\ c \end{pmatrix} = \begin{pmatrix} B_x \\ B_y \\ B_z \end{pmatrix}$$

$$\theta_4 = -a\tan 2\left(B_x, \sqrt{a^2 + c^2 - B_x^2}\right) + a\tan 2(a, c), \left(-\frac{\pi}{2} \le \theta_4 \le \frac{\pi}{2}\right)$$

$$\theta_3 = -a\tan 2\left(B_y, -\sqrt{X^2 + b^2 - B_y^2}\right) - a\tan 2(X, b), \left(-\frac{\pi}{2} \le \theta_3 \le \frac{\pi}{2}\right)$$

$$X \equiv a(\sin\theta_4) - c(\cos\theta_4)$$

The extracted pitch and yaw motions may be represented by DH notation as follows. DH parameters may be utilized to calculate an end of the mechanism, that is, a fingertip position through coordinate transformation and forward kinematics.

| DH parameters | | | |
|---|---|---|---|
| d | θ | a | α |
| 0 | 0 | 0 | $-\frac{\pi}{2}$ |
| 0 | $\theta_1$ | $l_1$ | $\frac{\pi}{2}$ |
| 0 | $\theta_2$ | $l_2$ | 0 |
| 0 | $-\frac{\pi}{2}$ | $l_3$ | 0 |
| 0 | $\theta_3$ | $l_4$ | 0 |
| 0 | $\theta_4$ | $l_5$ | 0 |
| 0 | $-\frac{\pi}{2}$ | $l_6$ | 0 |
| 0 | $\frac{\pi}{2}$ | $l_7$ | 0 |

In the above description, $l_i$ (i=1 ... 7) is a numerical value corresponding to a length of each link.

As described above, the three-dimensional magnetic sensor based finger motion capture interface device according to the present invention precisely measures a motion at a low manufacturing cost by applying a mechanism having four degrees of freedom using a low-cost non-contact type three-dimensional magnetic sensor which may sense a motion of a finger to precisely measure a motion of the finger.

Further, a touch feeling generating actuator (a vibration actuator) is installed at a fingertip to generate vibration when a tracked virtual finger touches a virtual object to provide the user in the real world with a touch feeling as if the user touches a real-world object.

Although the present invention has been described in detail with reference to exemplary embodiments, it is not limited thereto and it is obvious to those skilled in the art that variations and modifications may be made in various forms without departing from the spirit and scope of the invention. Accordingly, the true scope of protection of the present invention should be construed according to the following claims, and all technical spirits within the equivalent scope should be interpreted as being included in the scope of the present invention.

The invention claimed is:

1. A three-dimensional magnetic sensor based finger motion capture interface device, comprising: a back-of-hand fixing member in which a coupling hole is formed at one side; a first link member which is mechanically coupled to the coupling hole of the back-of-hand fixing member and has a first magnet installed therein; a second link member in which one end connected to the first link member is formed by a first spherical joint unit, a first gear is formed at the other end, and a first magnetic sensor is embedded in the first spherical joint unit; a first fixing member which fixes the second link member to the first link member through a second gear which is combined with the first gear of the second link member; a third link member having one end which is pivotably coupled to the first fixing member; a fourth link member in which a second spherical joint unit having a second magnetic sensor is formed in one end and a third gear is formed at the other end; a second fixing member which couples the fourth link member to the third link member through a fourth gear which is combined with the third gear of the fourth link member; a fifth link member which is coupled to the second fixing member and has a second magnet provided therein; a finger wearing member which is coupled to the fifth link member and has a finger seating member; and a controller which receives sensor coordinate values corresponding to the change of a magnetic line of force sensed by the first magnetic sensor of the second link member and the second magnetic sensor of the fourth link member, extracts pitch and yaw motions of each link member based on the received sensor coordinate values, and calculates a user's finger position based on the extracted pitch and yaw motion values; and wherein the first gear of the second link member and the second gear of the first fixing member are combined with each other to form one bevel near structure.

2. The three-dimensional magnetic sensor based finger motion capture interface device of claim 1, wherein the coupling hole of the back-of-hand fixing member has a form of an elongated hole.

3. The three-dimensional magnetic sensor based finger motion capture interface device of claim 1, wherein the first magnet is configured by one pair of magnets which is disposed such that a magnetic line of force flowing from an N pole of one magnet flows into an S pole of the other magnet and center axis lines of the pair of magnets perpendicularly intersect each other.

4. The three-dimensional magnetic sensor based finger motion capture interface device of claim 1, wherein the third gear of the fourth link member and the fourth gear of the second fixing member are combined with each other to form one bevel gear structure.

5. The three-dimensional magnetic sensor based finger motion capture interface device of claim 1, wherein the second magnet of the fifth link member is configured by one pair of magnets which is disposed such that a magnetic line of force flowing from an N pole of one magnet flows into an S pole of the other magnet and center axis lines of the pair of magnets perpendicularly intersect each other.

6. The three-dimensional magnetic sensor based finger motion capture interface device of claim 1, wherein the finger seating unit of the finger wearing member is formed to have a curved surface having a predetermined curvature.

7. The three-dimensional magnetic sensor based finger motion capture interface device of claim 1, wherein a touch feeling generating actuator which transmits a feedback when a tracked virtual finger touches a virtual object is provided at an end of the finger wearing member.

8. The three-dimensional magnetic sensor based finger motion capture interface device of claim 1, wherein the controller reads a motion having two degrees of freedom from the first magnetic sensor of the second link member and reads a motion having two degrees of freedom from the second magnetic sensor of the fourth link member to receive a motion having four degrees of freedom.

9. The three-dimensional magnetic sensor based finger motion capture interface device of claim 1, wherein the controller converts a magnetic vector value (Bx, By, Bz) received from the first magnetic sensor and the second magnetic sensor into rotation movements of the second link member and the fourth link member and applies the rotation movements to a forward kinetic equation to extract a shape of a multi-joint exoskeleton mechanism to calculate a position and a direction of the finger wearing member.

* * * * *